United States Patent
Tzeng

(10) Patent No.: US 6,755,616 B1
(45) Date of Patent: Jun. 29, 2004

(54) METHOD OF NOISE VALUE CONTROL BY CONTROLLING THE ROTATION RATE OF A FAN

(75) Inventor: Yih-Wei Tzeng, Taipei (TW)

(73) Assignee: Inventec Corporation, Taipei (TW)

( * ) Notice: Subject to any disclaimer, the term of this patent is extended or adjusted under 35 U.S.C. 154(b) by 0 days.

(21) Appl. No.: 10/357,425

(22) Filed: Feb. 4, 2003

(51) Int. Cl.[7] ............................................. B64C 11/00
(52) U.S. Cl. ........................... 416/1; 416/500; 381/71.3
(58) Field of Search ............................. 416/1, 500, 61; 415/118–119; 381/71.3

(56) References Cited

U.S. PATENT DOCUMENTS

| | | | | | |
|---|---|---|---|---|---|
| 5,731,674 A | * | 3/1998 | Jeske | ........................ | 318/439 |
| 6,134,667 A | * | 10/2000 | Suzuki et al. | ............... | 713/300 |
| 6,182,902 B1 | * | 2/2001 | Shih | ............................ | 236/35 |
| 6,340,874 B1 | * | 1/2002 | Vladimir | .................... | 318/471 |

* cited by examiner

*Primary Examiner*—Edward K. Look
*Assistant Examiner*—J M McAleenan
(74) *Attorney, Agent, or Firm*—Birch, Stewart, Kolasch & Birch, LLP

(57) ABSTRACT

A method of noise value control by controlling the rotation rate of a fan utilizes a set temperature control plot to estimate the noise value of fans and temperature changes of CPUs corresponding to the fans to optimize thermal energy absorption, achieve a suitable noise value, and take less manpower and time.

5 Claims, 6 Drawing Sheets

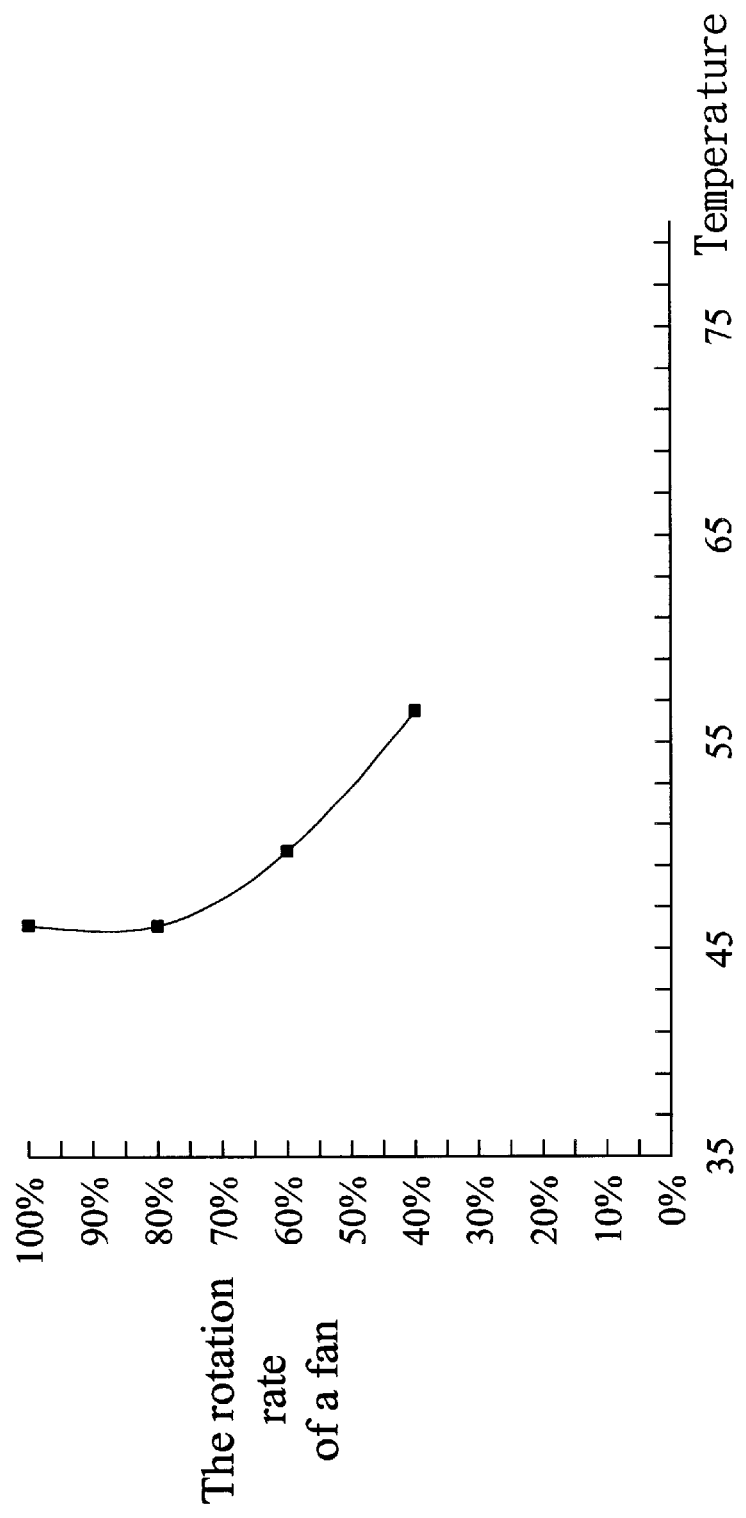

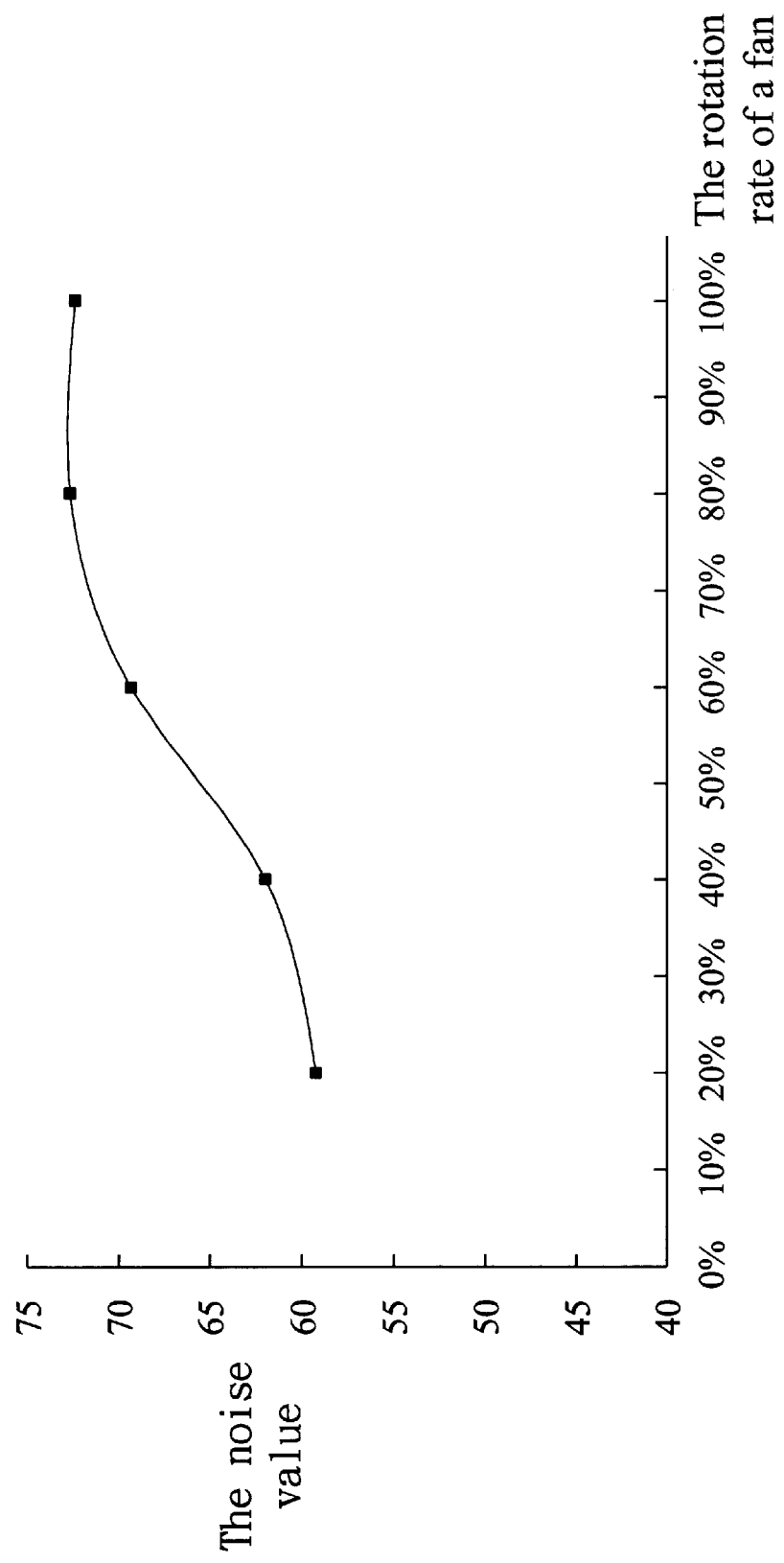
Appendix 2

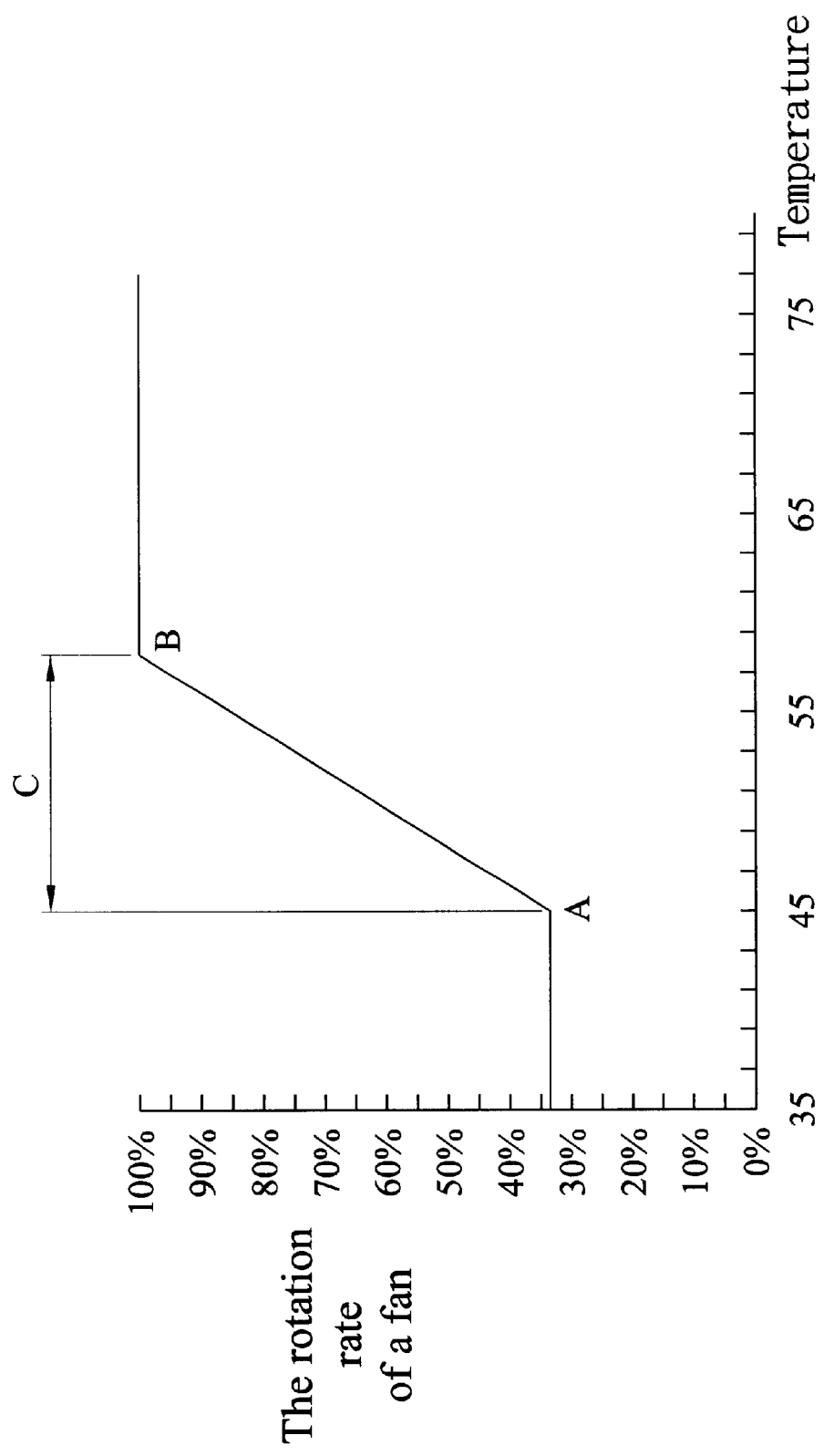

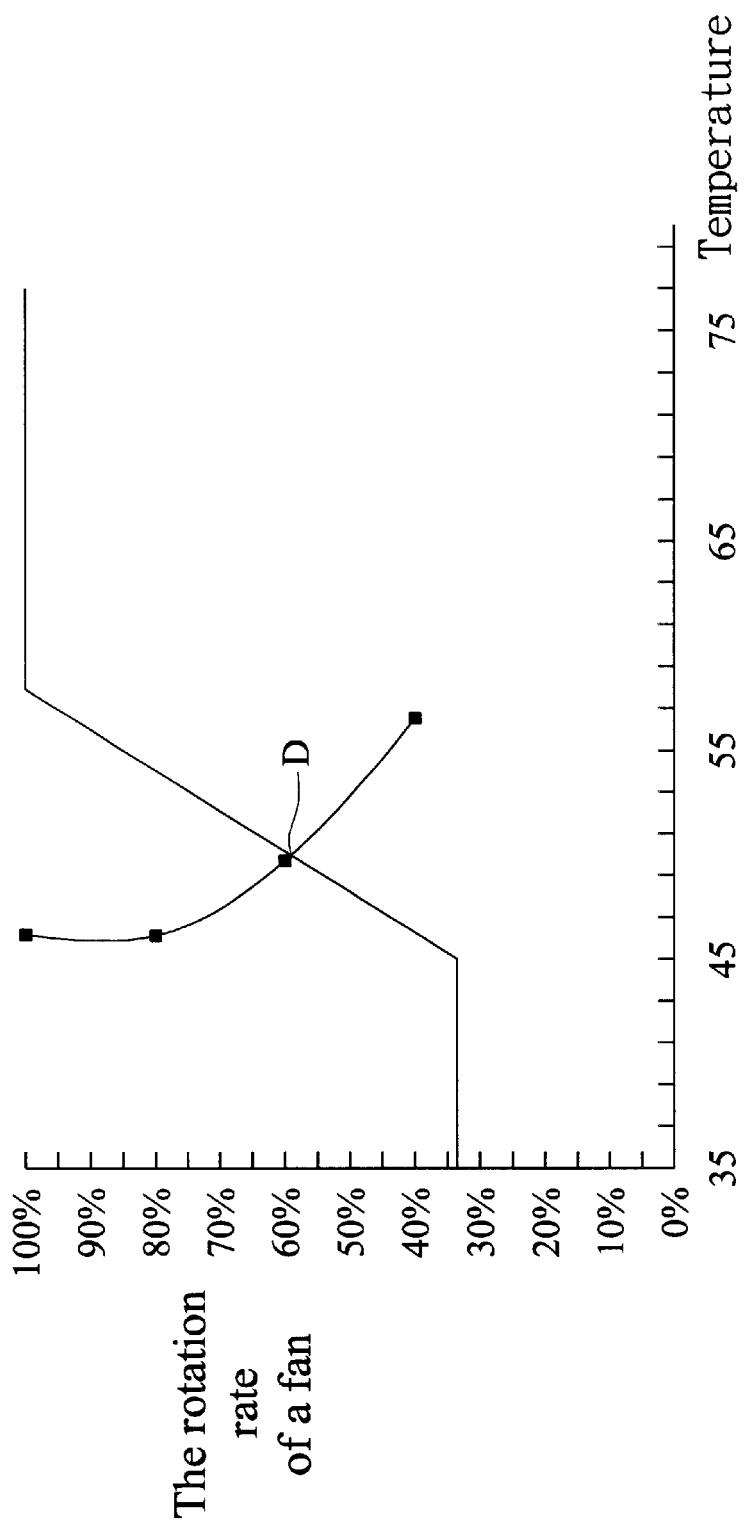

METHOD OF NOISE VALUE CONTROL BY CONTROLLING THE ROTATION RATE OF A FAN

BACKGROUND OF THE INVENTION

1. Field of Invention

The invention relates to a method of noise value control by controlling the rotation rate of a fan and, in particular, to a method that estimates the noise value of a fan by setting a temperature control plot.

2. Related Art

Since the creation of Pentium processors, the working frequency of CPUs has ranged from 133 MHz to 2.5 GHz. Popular CPUs used the manufacturing technology of 0.18 micrometers or 0.13 micrometers, but CPUs with high-speed data processing that consist of many transistors generate more thermal energy than before. Today, the power of CPUs with a frequency up to 1 GHz is more than 40 watts, and the power of CPUs such as Pentium 4s with a frequency up to 2 GHz is 70 watts. Such high power causes more thermal energy in the CPUs. If no methods are employed for removing thermal energy immediately in summer, the CPUs may become damaged and prematurely aged. It is thus important to create fans that remove the thermal energy of computers effectively.

The thermal energy of CPUs increases rapidly with the improving working frequency of CPUs. Many manufacturers are trying methods to enhance the rotation rate of fans or include more fans for improving the removing effect. A higher fan rotation rate and more fans cause more noise. Thus finding a balance between rotation rate of fans and noise of fans is a goal of fan design.

Generally speaking, the methods of reducing fan noise can be categorized into two types: one is improving bearings of fans, and the other is reducing the rotation rate of fans. In the former method, the bearings of fans are categorized into three types: sleeve bearing fans, ball bearing fans, and magnetic bearing fans. The operation of sleeve bearing fans causes sliding friction and the operation of ball bearing fans causes rolling friction, so more noise is produced in operation. The operation of magnetic bearing fans reduces the noise of sleeve bearing friction. Acceptance of magnetic bearing fans is not as widespread because of immature manufacturing technology and high expense.

The latter method of reducing rotation rate is an obvious way for reducing fan noise. Fans of fixed rotation rates produce fixed noise values, so changing one fan to another fan is the only way to reduce the noise value. There are no definite adjusting methods for setting control parameters of rotation rate. The only method is adjusting fan rotation rate slowly until the noise value is acceptable, but this wastes manpower and time. It is thus an important issue to reduce noise value by controlling the rotation rate of a fan.

SUMMARY OF THE INVENTION

The object of the invention is to provide a method of noise value control by controlling the rotation rate of a fan. The method involves estimating the noise value of a fan by setting a temperature control plot. The method also estimates the noise value of fans and temperature changes of CPUs corresponding to the fans to optimize thermal energy absorption, achieve a suitable noise value, and take less manpower and time.

In accordance with the invention, the method of noise value control by controlling the rotation rate of a fan comprises the following steps:

acquiring a fan module first;

acquiring a corresponding relation of values of the temperature of a target member and values of the operation parameters of the fan module, and a corresponding relation of values of the operation parameters of the fan module and values of the noise;

plotting a relation chart according to values of the temperature of the target member and values of the operation parameters of the fan module, and a relation chart according to the values of the operation parameters of the fan module and values of the noise;

setting a temperature control plot, and plotting it into the relation chart according to the values of the temperature of the target member and values of the operation parameters of the fan module;

obtaining an intersection point (called an operation point) of the fan module, the temperature control plot and the relation chart according to the values of the temperature of the target member and the values of the operation parameters of the fan module;

obtaining the operation parameter value corresponding to the operation point from the relation chart according to the values of the temperature of the target member and the values of the operation parameters of the fan module;

obtaining the noise value corresponding to the operation point from the relation chart according to the values of the operation parameters of the fan module and the values of the noise; and finally, achieving and maintaining a tolerant range of noise values.

Further scope of applicability of the invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below illustration only, and thus are not limitative of the present invention, and wherein.

Appendix 1 shows a relation chart according to the values of the temperature of a CPU and the values of the rotation rate of a fan;

Appendix 2 shows a relation chart according to the noise values and the values of the rotation rate of a fan;

Appendix 3 shows a chart of the temperature control plot; and

Appendix 4 shows a chart of the plot of the temperature of a CPU and the values of the rotation rate of a fan, and a temperature control plot.

DETAILED DESCRIPTION OF THE INVENTION

Figure 1A:
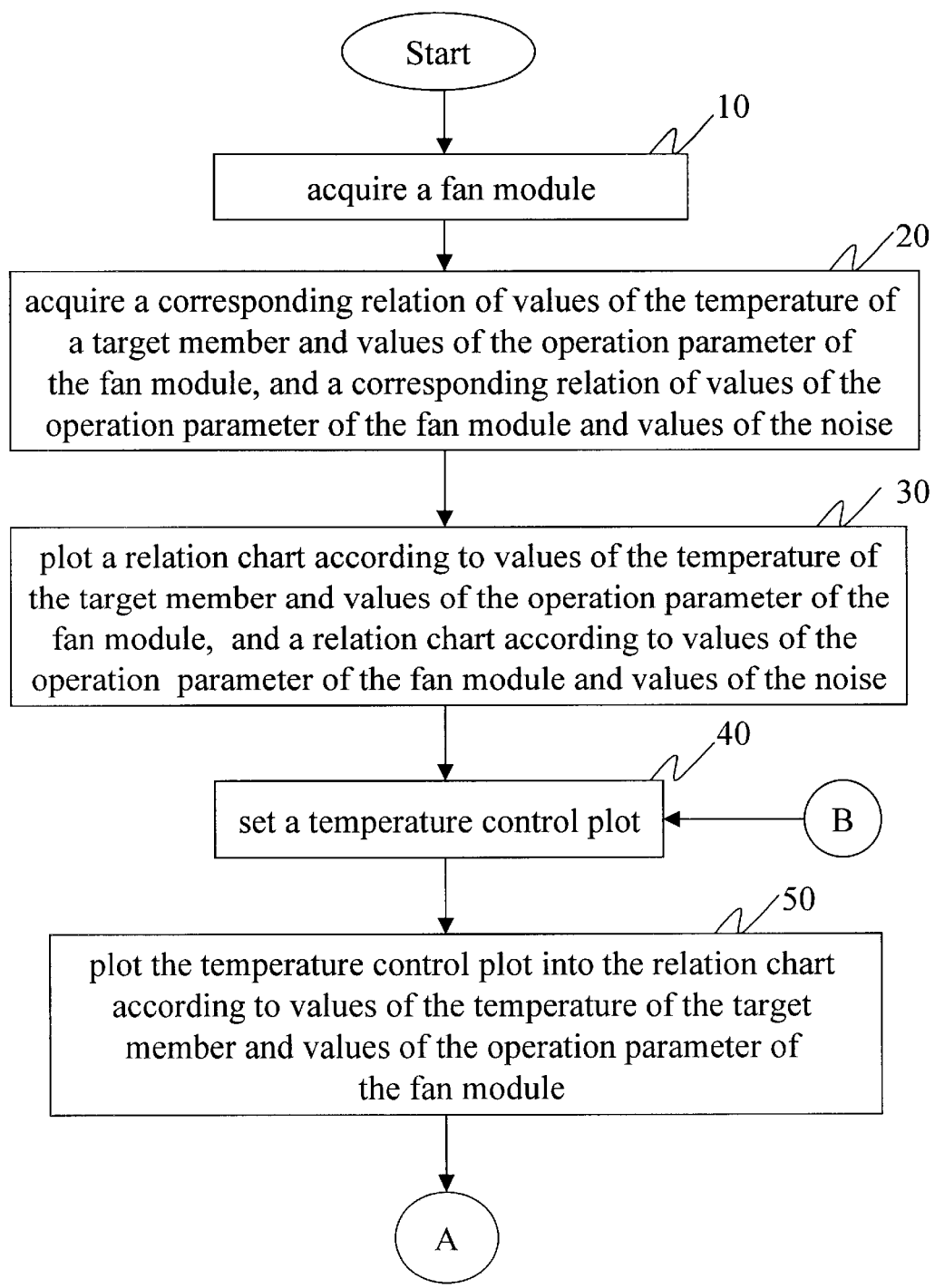
FIGS. 1A and 1B show a flowchart of the invention.
Figure 1B:
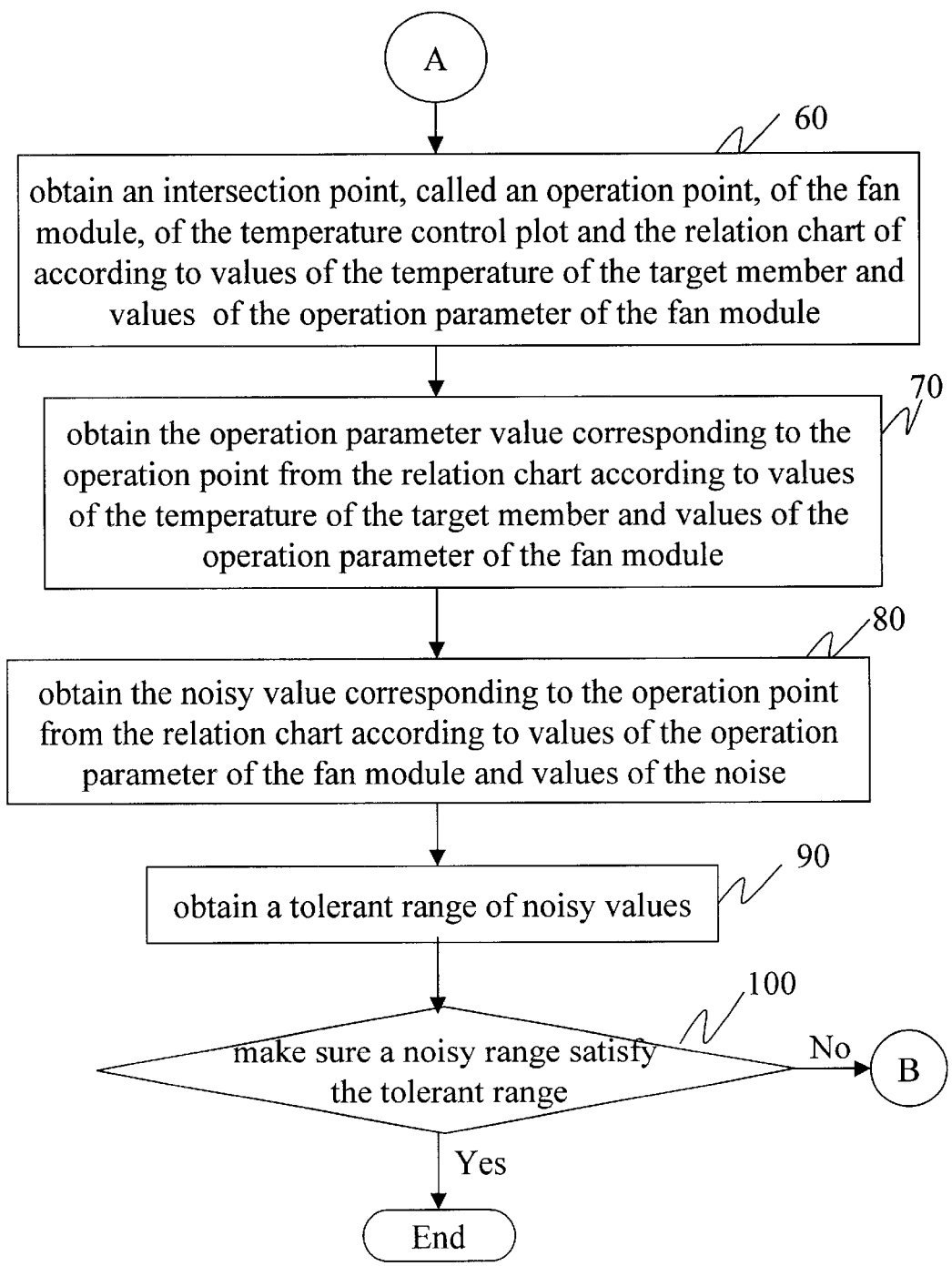

The method of noise value control by controlling the rotation rate of a fan estimates the noise value of fans and the temperature of CPUs corresponding to the fans to achieve optimal thermal energy absorption and a suitable noise value. The method of the invention requires less manpower and time than does the trial and error method. As shown in FIGS. 1A and 1B, the method of the invention comprises the following steps:

First, acquire a fan module (step 10). As shown in FIG. 1A, the fan module is a fan in a personal computer or a notebook computer.

Then, acquire a corresponding relation of values of the temperature of a target member and the values of the operation parameters of the fan module, and a corresponding relation of values of the operation parameters of the fan module and noise values (step 20). Take a CPU, the most important element in a computer, for example herein. The operation parameter of the fan module is the rotation rate of the fan. Acquire the corresponding relation of the temperature of the running CPU and the rotation rate of the running fan by experimentation. Also, the corresponding relation of values of the operation parameters of the fan module and the noise values is acquired by experimentation.

As shown in appendixes 1 and 2, plot a relation chart according to the values of the temperature of the target member and the values of the operation parameters of the fan module, and a relation chart according to the values of the operation parameters of the fan module and the noise values (step 30).

Set a temperature control plot (step 40), as shown in appendix 4. The temperature control plot is determined by the following factors: (1) the lowest rotation rate of the fan, (2) the lowest working temperature, (3) the working range of the fan, and (4) the highest rotation rate of the fan. The lowest rotation rate of the fan and the lowest working temperature are set according to the designers' intentions. The intersection point of the lowest rotation rate of the fan and the lowest working temperature is the minimum point A of the feasible operation area of the fan. The highest rotation rate of the fan makes the maximum point B. The working range of fans C includes the operation area of the fan between the minimum point A and the maximum point B. In this embodiment, take the relation chart of the temperature of the running CPU and the rotation as the source of the temperature control plot for simplifying the description.

Plot the temperature control plot into the relation chart according to the values of the temperature of the target member and values of the operation parameters of the fan module (step 50). This step involves plotting the temperature control plot shown in appendix 3 into the relation chart shown in appendix 1.

As shown in FIG. 1B, obtain an intersection point (called an operation point) of the fan module, the temperature control plot and the relation chart according to the values of the temperature of the target member and the values of the operation parameters of the fan module (step 60). This step involves obtaining the intersection point D of the fan module, the temperature control plot and the relation chart according to the values of the temperature of the target member and the values of the operation parameters of the fan module. The intersection point D is the operation point of the fan.

Obtain the operation parameter value corresponding to the operation point from the relation chart according to the values of the temperature of the target member and the values of the operation parameters of the fan module (step 70). This means obtaining the values of the rotation rate of the fan corresponding to the operation point from the relation chart according to the values of the temperature of the CPU and the values of the rotation rate of the fan.

Obtain the noise value corresponding to the operation point from the relation chart according to the values of the operation parameters of the fan module and the noise values (step 80). This means obtaining the noise value corresponding to the value of the operation point rotation rate from the relation chart according to the values of the rotation rate of the fan and the noise values.

Finally, obtain a tolerant range of noise values (step 90), and make sure the range of noise satisfies the range of tolerance (step 100). This means obtaining a tolerant range of noise values according to the customer's demands. Compare the noise range corresponding to the rotation rate of the fan and the tolerant range of noise values. If the noise range falls into the tolerant range of noise values, the method of the invention is completed. If the noise range is over the tolerant range of noise values, return to step 40 and continue the following steps until the noise range satisfies the tolerant range.

Also, reducing the value of the minimum point A creates a new temperature control plot. Then, obtain the new intersection point D, the value of the rotation rate, and the noise value corresponding to the new intersection point D.

The invention estimates the noise value of fans and temperature changes of CPUs corresponding to the fans to optimize thermal energy absorption and achieve a suitable noise value.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method of noise value control through controlling the rotation rate of a fan, which comprises:

(a) acquiring a fan module;

(b) acquiring a corresponding relation of values of the temperature of a target member and values of the operation parameter of the fan module, and a corresponding relation of values of the operation parameter of the fan module and values of the noise;

(c) plotting a relation chart according to values of the temperature of the target member and values of the operation parameter of the fan module, and a relation chart according to values of the operation parameter of the fan module and values of the noise;

(d) setting a temperature control plot;

(e) plotting the temperature control plot into the relation chart according to values of the temperature of the target member and values of the operation parameter of the fan module;

(f) obtaining an intersection point, called an operation point, of the fan module, of the temperature control plot and the relation chart of according to values of the temperature of the target member and values of the operation parameter of the fan module;

(g) obtaining the operation parameter value corresponding to the operation point from the relation chart according to values of the temperature of the target member and values of the operation parameter of the fan module;

(h) obtaining the noisy value corresponding to the operation point from the relation chart according to values of the operation parameter of the fan module and values of the noise;

(i) obtaining a tolerant range of noisy values; and (j) making sure the noisy value satisfy the tolerant range.

2. The method of claim 1, wherein the operation parameter is the rotation rate.

3. The method of claim 1, wherein the target member is a CPU.

4. The method of claim 1, wherein the temperature control plot is decided by the lowest rotation rate, the smallest working temperature, the working range, and the highest rotation rate of the fan module.

5. The method of claim 1, wherein the result of the step (j) is no, then proceed the steps of (d) to (j) until the noise value satisfy the tolerant range.

* * * * *